(12) United States Patent
Park et al.

(10) Patent No.: US 9,394,601 B2
(45) Date of Patent: Jul. 19, 2016

(54) HARD FILM FOR CUTTING TOOL

(71) Applicant: KORLOY INC., Seoul (KR)

(72) Inventors: Je-Hun Park, Cheongju-si (KR);
Jae-Hoon Kang, Cheongju-si (KR);
Seung-Su Ahn, Cheongju-si (KR);
Sung-Hyun Kim, Cheongju-si (KR);
Jung-Wook Kim, Cheongju-si (KR);
Sung-Gu Lee, Cheongju-si (KR);
Sun-Yong Ahn, Cheongju-si (KR);
Dong-Bok Park, Cheongju-si (KR)

(73) Assignee: KORLOY INC., Seoul (KR)

( * ) Notice: Subject to any disclaimer, the term of this patent is extended or adjusted under 35 U.S.C. 154(b) by 0 days.

(21) Appl. No.: 14/398,127

(22) PCT Filed: Mar. 18, 2013

(86) PCT No.: PCT/KR2013/002188
§ 371 (c)(1),
(2) Date: Oct. 31, 2014

(87) PCT Pub. No.: WO2013/165092
PCT Pub. Date: Nov. 7, 2013

(65) Prior Publication Data
US 2015/0125678 A1 May 7, 2015

(30) Foreign Application Priority Data

May 2, 2012 (KR) .................. 10-2012-0046532

(51) Int. Cl.
| | |
|---|---|
| *C23C 14/06* | (2006.01) |
| *B32B 15/01* | (2006.01) |
| *C23C 28/04* | (2006.01) |
| *C23C 28/00* | (2006.01) |
| *C23C 14/32* | (2006.01) |

(52) U.S. Cl.
CPC ............. *C23C 14/0641* (2013.01); *B32B 15/01* (2013.01); *C23C 14/325* (2013.01);
(Continued)

(58) Field of Classification Search
USPC ............ 51/307, 309; 428/216, 336, 697, 698, 428/699
See application file for complete search history.

(56) References Cited

U.S. PATENT DOCUMENTS 5,700,551 A * 12/1997 Kukino ............... C04B 35/5831
428/216
7,901,796 B2 * 3/2011 Fukui ..................... B23P 15/28
428/697

(Continued)

FOREIGN PATENT DOCUMENTS

JP 2001-198709 * 7/2001
JP 2008-260098 A 10/2008
(Continued)

OTHER PUBLICATIONS

Barshilla et al "Growth and characterization of TiAlN/CrAlN superlattices prepared by reactive direct current magentron sputtering" J. Vac. Sci. Technol. A 27(1) Jan./Feb. 2009.*

*Primary Examiner* — Archene Turner
(74) *Attorney, Agent, or Firm* — Revolution IP, PLLC (57) ABSTRACT

Provided is a hard film formed on a surface of a base material, the hard film being comprised of a nano multi-layered structure formed by stacking a thin layer A, a thin layer B a thin layer C in order of thin layers A-B-A-C from the base material or being comprised of a structure formed by repeatedly stacking the nano multi-layered structure at least twice, wherein the thin layer A is comprised of $Ti_{1-x}Al_xN$ (0.3≤x≤0.7); the thin layer B is comprised of $Al_{1-y}Cr_yN$ (0.3≤y≤0.7); and the thin layer C is comprised of MeN (where Me is any one of Nb, V, and Cr).

5 Claims, 1 Drawing Sheet

(52) U.S. Cl.
CPC ............ C23C28/042 (2013.01); C23C 28/044 (2013.01); C23C 28/42 (2013.01); *Y10T 428/24975* (2015.01); *Y10T 428/265* (2015.01)

(56) References Cited

U.S. PATENT DOCUMENTS

8,586,175 B2 * 11/2013 Chang ................. C23C 14/0641 428/699

2008/0166583 A1 7/2008 Astrand
2011/0111197 A1 5/2011 Johansson et al.

FOREIGN PATENT DOCUMENTS

| JP | 2009-125832 | * | 6/2009 |
| JP | 2010-207918 | A | 9/2010 |
| JP | 2012-035378 | A | 2/2012 |
| KR | 10-2009-0094108 | A | 9/2009 |

* cited by examiner

HARD FILM FOR CUTTING TOOL

CROSS REFERENCE TO PRIOR APPLICATIONS

This application is a National Stage Application of PCT International Patent Application No. PCT/KR2013/002188 filed on Mar. 18, 2013, under 35 U.S.C. §371, which claims priority to Korean Patent Application No. 10-2012-0046532 filed on May 2, 2012, which are all hereby incorporated by reference in their entirety.

TECHNICAL FIELD

The present invention relates to a hard film formed on a hard base material such as a hard metal, a cermet, a high-speed steel, an end mill, a drill, a cNB or the like that is used in a cutting tool, and more particularly, to a hard film for a cutting tool comprised of a nano multi-layered structure formed by stacking a thin layer A, a thin layer B and a thin layer C in order of A-B-A-C or comprised of a repeatedly stacked structure thereof, thus improving all of abrasion resistance, lubrication, toughness and chipping resistance compared to an existing multi-layered thin film structure.

BACKGROUND ART

As the industry gradually advances toward fineness, speedup and mass production, it is required to improve cutting performance and life cycle of a cutting tool. Especially, since high heat of 900° C. or more is locally generated on a front end of the cutting tool rubbing with a workpiece in a rapid cutting of a workpiece having a high hardness and a cutting of a difficult-to-cut material having a low thermal conductivity, life cycle of the cutting tool may be improved by forming a hard film having excellent oxidation resistance and abrasion resistance on a cutting surface of the cutting tool.

In order to improve the cutting performance and life cycle, a single-layered hard film including TiN, $Al_2O_3$, TiAlN, AlTiN, AlCrN or the like having abrasion resistance, oxidation resistance, impact resistance and the like, or a multi-layered hard film in which the single-layered hard films are stacked in two layers or more, is formed on a hard base material such as a hard metal, a cermet, a high speed steel, an end mill, a drill, or the like to cope with demands for the high hardness workpiece and the difficult-to-cut material.

Recently, the hardness of the workpiece is gradually increased, and a demand for processing of a difficult-to-cut material having a low thermal conductivity and severely fused on a tool is also increased. Especially, since stainless steel, heat-resistant alloy steel, ductile cast iron and the like have a low thermal conductance compared to general steels, cutting heat is not emitted due to chips in a cutting and heat is concentrated on a cutting edge portion of the cutting tool, abrasion, seizure and exfoliation phenomena are easily generated on the cutting edge of the cutting tool due to a chemical reaction between the cutting tool and the workpiece, and life cycle of the cutting tool is rapidly reduced.

Therefore, only with the single layered or multi-layered structures having a composition described above, it becomes more and more difficult to cope with a demand for a cutting tool for the cutting of such a difficult-to-be cut material and ductile cast iron, which are required to evenly have characteristics such as excellent abrasion resistance, oxidation resistance and lubrication.

Therefore, trials improving the cutting performance are recently increased through a method for regularly and repeatedly stacking at least two thin films having a nano level that are different in material property.

For example, Korea Patent No. 876366 discloses a thin film structure in which a lower layer is deposited on an insert, an end mill, a drill or a cermet which is a hard metal tool through a physical vapor deposition, in order to improve an adhesion force and align the orientation of crystal grains in the direction of (200) plane, a (Ti,Al)N multi-layered thin film which is a middle layer is continuously deposited in order to improve impact resistance and chipping resistance, and a top layer which is comprised of TiAlN or AlTiSiN, is constituted by layer A, layer B, layer C and layer D and has a structure in which layer A, layer B, layer C and layer D are alternately stacked, is formed to improve the abrasion resistance and oxidation resistance of the top layer.

While the abrasion resistance and oxidation resistance may be improved through the multi-layered structure as described above, development of a hard film having a novel structure is required in order to evenly improve various characteristics such as abrasion resistance, impact resistance (toughness) and chipping resistance required for the cutting.

DISCLOSURE

Technical Problem

The present invention provides a hard film for a cutting tool by which abrasion resistance, lubrication, toughness (impact resistance) and chipping resistance are generally improved.

Technical Solution

According to an embodiment of the present invention, a hard film formed on a surface of a base material, the hard film being comprised of a nano multi-layered structure formed by stacking a thin layer A, a thin layer B a thin layer C in order of thin layers A-B-A-C from the base material or being comprised of a structure formed by repeatedly stacking the nano multi-layered structure at least twice, wherein the thin layer A is comprised of $Ti_{1-x}Al_xN$ ($0.3 \leq x \leq 0.7$); the thin layer B is comprised of $Al_{1-y}Cr_yN$ ($0.3 \leq y \leq 0.7$); and the thin layer C is comprised of MeN (where Me is any one of Nb, V, and Cr).

According to another embodiment of the present invention, it is preferable that each of the thin layer A, the thin layer B and the thin layer C have an average thickness of 3 nm to 50 nm.

According to another embodiment of the present invention, it is preferable that each of the thin layer A, the thin layer B and the thin layer C have an average thickness of 20 nm to 40 nm.

According to another embodiment of the present invention, it is preferable that the hard film have an average thickness of 1 μm to 20 μm.

According to another embodiment of the present invention, it is preferable that the hard film have a degradation hardness not less than 35 GPa when degradation-treated at a temperature of 900° C. for 30 minutes.

Advantageous Effects

According to a hard film for a cutting tool of the present invention, since various characteristics required for a hard film for a cutting tool, such as abrasion resistance, lubrication, toughness, and chipping resistance, may be evenly improved through an alternated and repeated stacking of a nano-multi-layered structure formed by stacking, in order of thin layers A-B-A-C, a Ti and Al composite nitride layer (a thin layer A)

having excellent abrasion resistance, an Al and Cr composite nitride layer (a thin layer B) having excellent lubrication and any one of Nb, V and Cr nitride layer (a thin layer C) having excellent toughness and chipping resistance and having lubrication improved under a high temperature environment, the hard film for the cutting tool may be suitably used in cutting a difficult-to-cut material.

That is, in the hard film for the cutting tool of the present invention, thin layers for reinforcing abrasion resistance, lubrication, toughness and chipping resistance are periodically and repeatedly stacked to maximize the functions of the respective thin layers, thus capable of harmoniously improving abrasion resistance, lubrication, toughness and chipping resistance required for a cutting the difficult-to-cut material.

BEST MODE

Hereinafter, embodiments of the present invention will be described with reference to the accompanying drawings to fully explain the present invention in such a manner that it may easily be carried out by a person with ordinary skill in the art to which the present invention pertains. The present invention may, however, be embodied in different forms and should not be construed as limited to the embodiments set forth herein. Also, in the figures, the dimensions of layers and regions are exaggerated for clarity of illustration.

Figure 1:
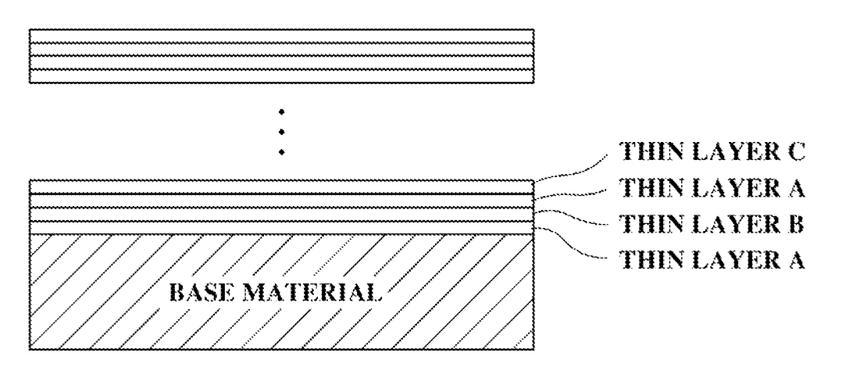
FIG. 1 is a schematic cross-sectional view illustrating a structure of a hard film for a cutting tool according to the present invention.

FIG. 1 is a schematic cross-sectional view illustrating a structure of a hard film for a cutting tool according to the present invention. As illustrated in FIG. 1, a thin film for a cutting tool according to preferable Example of the present invention has a structure in which a thin layer A, a thin layer B and a thin layer C are sequentially stacked on a base material to form a nano multi-layered structure, and the nano multi-layered structure is repeatedly stacked twice or more.

The thin layer A is a thin layer aiming to mainly improve abrasion resistance and hardness, and has a composition that is comprised of $Ti_{1-x}Al_xN$ (0.3≤x≤0.7).

In the thin layer A, when an Al content is less than 0.3, since Al having an atomic radius smaller than that of Ti, is substituted, and thus a solid solution amount of Al is decreased, abrasion resistance and hardness of the thin film are reduced, and since a $TiO_2$ oxide is easily formed under a high temperature environment in a cutting, a Ti atom in the thin film may be diffused to the outside to incur a high temperature hardness reduction due to depletion of the Ti atom, and when an Al content is more than 0.7, since a phase having a hexagonal B4 structure is formed to reduce abrasion resistance and life cycle of a tool. Accordingly, it is preferable that the Al content be 0.3 to 0.7.

The thin layer B is a thin layer aiming to mainly improve lubrication, and has a composition that is comprised of $Al_{1-y}Cr_yN$ (0.3≤y≤0.7).

when a Cr content is less than 0.3, insulation is increased and thus DC deposition is difficult due to a characteristic of equipment, and hcp-AlCrN instead of fcc-AlCrN is formed to increase brittleness and to reduce abrasion resistance and life cycle of the tool, and when the Cr content is more than 0.7, a coarse thin film structure is formed and concurrently, segregation of $Cr_2N$ is formed in an operation, such as a cutting accompanied by high temperature to reduce abrasion resistance and life cycle of the tool. Accordingly, it is preferable that the Cr content be 0.3 to 0.7.

The thin layer C is a thin layer aiming to mainly improve toughness and chipping resistance, and is comprised of NbN, Vn or CrN basically having excellent fracture toughness and chipping resistance. Such a thin layer C is phase-changed into $V_2O_5$, $Nb_2O_5$ or $Cr_2O_3$ in a high temperature work environment, and thus a lubricant characteristic is improved, so that an improvement in such a lubricant characteristic prevents a film from being exfoliated together with a workpiece to more improve chipping resistance and toughness in an operation with respect to the workpiece having relatively high ductility.

Like this, the thin layer C comprised of NbN, VN or CrN forms a multi-layer having a nano level together with thin films having a different component, and thus allows the hard film for the cutting tool to have a characteristic evenly and highly balanced in various terms of toughness, chipping resistance, lubrication and abrasion resistance.

Meanwhile, it is preferable that each of the thin layer A, the thin layer B and the thin layer C have an average thickness of 3 nm to 50 nm.

This is because as the period of a nano multi-layered structure is decreased, occurrence and movement of dislocation are suppressed, and thus a thin film is reinforced, and when the thickness of the thin film is as thin as less more 3 nm, a mixing zone is formed by interdiffusion between two layers to reduce hardness and an elastic modulus while a boundary between the nano multi-layers for suppressing the occurrence and movement of the dislocation becomes unclear, so it is preferable that the thin film be formed in a thickness not less than 3 nm, and when the thickness is more than 50 nm, the occurrence and movement of the dislocation are easier, so that hardness and an elastic modulus are reduced and also coherency strain energy is reduced by formation of misfit dislocation, so that a reinforcement effect reduction phenomenon is accompanied, which is not preferable.

Also, it has been confirmed through an experiment in which only thicknesses of the layers are changed that since an excellent grain boundary reinforcement effect for suppressing movement of dislocation may be obtained through plastic deformation when thicknesses of the thin layer A, the thin layer B and the thin layer C are in a range of 20 nm to 40 nm, this thickness range is most preferable.

In preferable Example of the present invention, the thin layer A, the thin layer B and the thin layer C are sequentially stacked so as to form the nano multi-layered structure having the order of A-B-A-C, and in this manner, when the thin layer A, the thin layer B and the thin layer C forms the nano multi-layered structure having the order of A-B-A-C, a period of a difference between elastic coefficients different from each other and a period of a difference between lattice constants from each other may become shorter to maximize an effect of improvement in abrasion resistance compared to a nano multi-layered structure stacked in a different type such as thin layers A-B-C.

As described above, it is preferable that the thin film for the cutting tool according to the present invention having a nano multi-layered structure or a structure in which the nano multi-layered structure is repeatedly stacked at least twice, have an average thickness of 1 μm to 20 μm.

As described above, the present invention forms a nano multi-layered structure by sequentially stacking a TiAlN, AlCrN and TiAlN based thin layers and any one of NbN, VN, or CrN, and is characterized in evenly improving abrasion resistance, lubrication, toughness, and chipping resistance with respect to entire hard film.

Examples

In the present invention, a hard film was coated on a surface of a hard base material of WC-10 wt % Co by using an arc ion plating method that is a physical vapor deposition (PVD), the hard base material including a cermet, high speed steel, an end mill, drill or the like. In the coating, a TiAl target, an AlCr, and an Vn, V or Cr target were used with respect to a thin layer A, a thin layer B, and a thin layer C, respectively. An initial pressure was reduced to $8.5 \times 10^{-5}$ Torr or less, and N2 was introduced as a reaction gas. A gas pressure for coating was 30 mTorr or less and preferably 20 mTorr or less, a coating temperature was 400° C. to 550° C., and a substrate bias voltage was applied in −20 V to −150 V. Of course, the coating condition may be different from that of Example of the present invention according to an equipment characteristic and condition.

In Example of the present invention, a TiAlN film (a thin film A) that is an abrasion resistance layer, an AlCrN film (a thin film B) that is a lubrication layer, and a film (a thin film C) comprised of any one of NbN, VN or CrN that is a toughness layer were stacked at an average thickness of 20 nm in order of thin films A-B-A-C to form a nano multi-layered structure, and then such a nano multi-layered structure was repeatedly formed to manufacture a hard film for a cutting tool having a total thickness of 3.4 μm to 3.6 μm according to Example of the present invention.

Meanwhile, if necessary, it goes without saying that various types of thin film may be additionally formed on a hard film for a cutting tool formed according to Example of the present invention. Also, since a hard film for a cutting tool according to Example of the present invention uses a physical vapor deposition (PVD), a thin film thickness may be formed up to 20 μm.

The following Table 1 shows each of a composition, a target composition ratio, thin film average thickness, a total film thickness and a stack structure with respect to a hard film for a cutting tool according to Example of the present invention.

TABLE 1

| | | Structure of Hard Film | | |
|---|---|---|---|---|
| Example No. | Nano Multi-layered Structure (Target Composition Ratio) | Thin Layer Average Thickness (nm) | Total Film Thickness (μm) | Stack Structure |
| 1 | TiAlN(5:5)/AlCrN(5:5)/TiAlN(5:5)/NbN | 20 | 3.5 | A/B/A/C |
| 2 | TiAlN(5:5)/AlCrN(5:5)/TiAlN(5:5)/VN | 20 | 3.5 | A/B/A/C |
| 3 | TiAlN(5:5)/AlCrN(5:5)/TiAlN(5:5)/CrN | 20 | 3.5 | A/B/A/C |
| 4 | AlTiN(67:33)/AlCrN(5:5)/AlTiN(67:33)/NbN | 20 | 3.6 | A/B/A/C |
| 5 | AlTiN(67:33)/AlCrN(5:5)/AlTiN(67:33)/VN | 20 | 3.6 | A/B/A/C |
| 6 | AlTiN(67:33)/AlCrN(5:5)/AlTiN(67:33)/CrN | 20 | 3.5 | A/B/A/C |
| 7 | TiAlN(5:5)/AlCrN(7:3)/TiAlN(5:5)/NbN | 20 | 3.5 | A/B/A/C |
| 8 | TiAlN(5:5)/AlCrN(7:3)/TiAlN(5:5)/VN | 20 | 3.5 | A/B/A/C |
| 9 | TiAlN(5:5)/AlCrN(7:3)/TiAlN(5:5)/CrN | 20 | 3.5 | A/B/A/C |
| 10 | AlTiN(67:33)/AlCrN(7:3)/AlTiN(67:33)/NbN | 20 | 3.6 | A/B/A/C |
| 11 | AlTiN(67:33)/AlCrN(7:3)/AlTiN(67:33)/VN | 20 | 3.5 | A/B/A/C |
| 12 | AlTiN(67:33)/AlCrN(7:3)/AlTiN(67:33)/CrN | 20 | 3.5 | A/B/A/C |

Also, in order to relatively evaluate characteristics of hard films for a cutting tool formed according to Examples of the present invention, hard films having almost the same thickness as Examples of the present invention were formed in thin film structures shown the following Table 2 on a base material of WC-10 wt % Co equal to that of Examples of the present invention.

TABLE 2

| | Structure of Hard Film | | | |
|---|---|---|---|---|
| Comparative Example No. | Nano Multi-layered Structure | Thin Layer Average Thickness (nm) | Total Film Thickness (μm) | Stack Structure |
| 1 | TiAlN(5:5)/AlCrN(7:3) | 20 | 3.5 | A/B |
| 2 | AlTiN(67:33)/AlCrN(7:3) | 19 | 3.5 | A/B |
| 3 | TiAlN(5:5)/AlCrN(5:5) | 18 | 3.4 | A/B |
| 4 | AlTiN(67:33)/AlCrN(5:5) | 19 | 3.6 | A/B |
| 5 | TiAlN(5:5)/NbN | 20 | 3.6 | A/B |
| 6 | TiAlN(5:5)/VN | 20 | 3.6 | A/B |
| 7 | TiAlN(5:5)/CrN | 10 | 3.6 | A/B |
| 8 | TiAlN(5:5)/AlCrN(7:3)/NbN | 20 | 3.7 | A/B/C |
| 9 | TiAlN(5:5)/AlCrN(7:3)/VN | 20 | 3.7 | A/B/C |
| 10 | TiAlN(5:5)/AlCrN(7:3)/CrN | 19 | 3.6 | A/B/C |
| 11 | AlTiN(67:33)/AlCrN(5:5)/NbN | 20 | 3.7 | A/B/C |
| 12 | AlTiN(67:33)/AlCrN(5:5)/VN | 20 | 3.5 | A/B/C |
| 13 | AlTiN(67:33)/AlCrN(5:5)/CrN | 20 | 3.15 | A/B/C |

As confirmed in Table 2, in Comparative Examples 1 to 4, a TiAlN film or an AlTiN film, and an AlCrN film were alternately stacked in an A/B/C stack structure at an average thickness of 18 nm to 20 nm to form hard films each having a total thickness of 3.4 μm to 3.6 μm, and in Comparative Examples 5 to 7, a TiAlN film, and NbN, VN or CrN film were alternately stacked in an A/B stack structure at an average thickness of 19 nm to 20 nm to form hard films each having a total thickness of 3.6 μm, these hard films are to confirm a cutting performance difference according to a nano multi-layer composition (where some thin films are excepted) difference and a stack structure (a structure in which two thin films are alternately stacked) difference from hard films for a cutting tool according to Examples of the present invention.

Also, in Comparative Examples 8 to 13, a TiAlN film, or an AlTi film, an AlCrN film, and a film comprised of any one of NbN, VN a CrN were alternately stacked in an A/B/C stack structure at an average thickness of 19 nm to 20 nm to form hard films each having a total thickness of 3.5 μm to 3.7 μm, here, theses hard films are to confirm a cutting performance difference according to a stack structure (a structure in which three thin films are alternately stacked) difference from hard films for a cutting tool according to Examples of the present invention.

The following Tables 3 and 4 show measurement results of real compositions of thin films constituting each layer measured by using an energy dispersive X-ray spectrometer (EDX) after hard films for a cutting tool according to Examples of the present invention and Comparative Examples were formed.

TABLE 3

| Example No. | Nano Multi-layered Structure (Target Composition Ratio) | Thin Film Composition (EDX, at %) | | | | | |
|---|---|---|---|---|---|---|---|
| | | Al | Ti | Cr | Nb | V | N |
| 1 | TiAlN(5:5)/AlCrN(5:5)/TiAlN(5:5)/NbN | 20.5 | 13.7 | 6.8 | 13.7 | 13.6 | 45.4 |
| 2 | TiAlN(5:5)/AlCrN(5:5)/TiAlN(5:5)/VN | 20.3 | 13.6 | 6.8 | | | 45.8 |
| 3 | TiAlN(5:5)/AlCrN(5:5)/TiAlN(5:5)/CrN | 20.5 | 13.7 | 20.5 | | | 45.4 |
| 4 | AlTiN(67:33)/AlCrN(5:5)/AlTiN(67:33)/NbN | 25.2 | 9.0 | 6.9 | 13.7 | | 45.2 |
| 5 | AlTiN(67:33)/AlCrN(5:5)/AlTiN(67:33)/VN | 25.6 | 9.2 | 7.0 | | 13.9 | 44.4 |
| 6 | AlTiN(67:33)/AlCrN(5:5)/AlTiN(67:33)/CrN | 25.7 | 9.2 | 21.0 | | | 44.1 |
| 7 | TiAlN(5:5)/AlCrN(7:3)/TiAlN(5:5)/NbN | 23.8 | 14.0 | 4.2 | 14.0 | | 44 |
| 8 | TiAlN(5:5)/AlCrN(7:3)/TiAlN(5:5)/VN | 23.5 | 13.8 | 4.1 | | 13.8 | 44.8 |
| 9 | TiAlN(5:5)/AlCrN(7:3)/TiAlN(5:5)/CrN | 23.8 | 14.0 | 18.17 | | | 44.1 |
| 10 | AlTiN(67:33)/AlCrN(7:3)/AlTiN(67:33)/NbN | 28.6 | 9.2 | 4.2 | 14.0 | | 44 |
| 11 | AlTiN(67:33)/AlCrN(7:3)/AlTiN(67:33)/VN | 28.1 | 9.1 | 4.1 | | 13.8 | 45 |
| 12 | AlTiN(67:33)/AlCrN(7:3)/AlTiN(67:33)/CrN | 28.6 | 9.2 | 18.2 | | | 44 |

TABLE 4

| Comparative Example No. | Nano Multi-layered Structure (Target Composition Ratio) | Thin Film Composition (EDX, at %) | | | | | |
|---|---|---|---|---|---|---|---|
| | | Al | Ti | Cr | Nb | V | N |
| 1 | TiAlN(5:5)/AlCrN(7:3) | 33.6 | 14 | 8.4 | | | 44 |
| 2 | AlTiN(67:33)/AlCrN(7:3) | 38.5 | 9.6 | 8.7 | | | 43.2 |
| 3 | TiAlN(5:5)/AlCrN(5:5) | 27.8 | 13.9 | 13.9 | | | 44.5 |
| 4 | AlTiN(67:33)/AlCrN(5:5) | 31.8 | 9.0 | 13.6 | | | 45.7 |
| 5 | TiAlN(5:5)/NbN | 13.5 | 13.5 | | 27.1 | | 45.9 |
| 6 | TiAlN(5:5)/VN | 13.6 | 13.6 | | | 27.2 | 45.7 |
| 7 | TiAlN(5:5)/CrN | 13.5 | 13.5 | 27.0 | | | 46.1 |
| 8 | TiAlN(5:5)/AlCrN(7:3)/NbN | 21.7 | 9.0 | 5.4 | 18.1 | | 45.8 |
| 9 | TiAlN(5:5)/AlCrN(7:3)/VN | 21.7 | 9.0 | 5.4 | | 18.1 | 45.8 |
| 10 | TiAlN(5:5)/AlCrN(7:3)/CrN | 21.8 | 9.1 | 23.7 | | | 45.4 |
| 11 | AlTiN(67:33)/AlCrN(5:5)/NbN | 22.6 | 6.4 | 9.7 | 19.3 | | 42 |
| 12 | AlTiN(67:33)/AlCrN(5:5)/VN | 22.2 | 6.3 | 9.5 | | 19 | 43 |
| 13 | AlTiN(67:33)/AlCrN(5:5)/CrN | 22.0 | 6.2 | 28.3 | | | 43.5 |

As confirmed in Table 3 described above, the formed hard films for a cutting tool have real compositions that are somewhat different from target compositions, but almost similar to the target compositions.

Evaluation of Room Temperature Hardness, Degradation Hardness, Friction Coefficient and Crack Length In order to compare and evaluate Examples 1 to 12 of the present invention and Comparative Examples 1 to 13 formed as described above, a microhardness test was performed using a Fisher scope (model name "HP100C-XYP"; Germany HELMUT FISCHER GMBH, ISO14577), and room temperature hardness directly after forming hard films and degradation hardness after a high temperature degradation treatment at a temperature of 900° C. for 30 minutes was measured, respectively.

Such a microhardness test was performed under conditions of a load of 30 mN, an unload of 30 mN, a load time of 10 sec, and a creep time of 5 sec Also, in order to evaluate a friction characteristic of the hard film, a sliding distance (60 revolutions of a ball (where a material is $Si_3N_4$, a diameter is 4 mm, and hardness is $HV_{50g}$ 1600) was measured through a ball-on-disc test by using a CETR UMT-2 micro-tribometer. At this time, the measurement was performed under conditions of a temperature of 20° C. to 25° C., a relative humidity of 50% to 60%, and a rotation speed of 318 rpm (10 m/min).

Also, in order to evaluate toughness (crack resistance) of the hard film, a length of a crack generated on the hard film was measured by applying a diamond pressure mark having a load of 30 kgf.

Measurement results of room temperature hardness, degradation hardness, a friction coefficient and a crack length obtained with respect to Examples 1 to 12 of Examples of the present invention and Comparative Examples 1 to 13 are shown in Tables 5 and 6, respectively.

TABLE 5

| Example No. | Nano Multi-layered Structure (Target Composition Ratio) | Room Temperature Hardness (GPa) | Degradation Hardness | Friction Coefficient (COF) | Crack Length (μm) |
|---|---|---|---|---|---|
| 1 | TiAlN(5:5)/AlCrN(5:5)/TiAlN(5:5)/NbN | 37 | 36.1 | 0.46 | 43 |
| 2 | TiAlN(5:5)/AlCrN(5:5)/TiAlN(5:5)/VN | 37.4 | 36.2 | 0.42 | 41 |
| 3 | TiAlN(5:5)/AlCrN(5:5)/TiAlN(5:5)/CrN | 36.2 | 35.8 | 0.39 | 44 |
| 4 | AlTiN(67:33)/AlCrN(5:5)/AlTiN(67:33)/NbN | 37.9 | 37 | 0.41 | 45 |
| 5 | AlTiN(67:33)/AlCrN(5:5)/AlTiN(67:33)/VN | 37.3 | 36.9 | 0.4 | 41 |
| 6 | AlTiN(67:33)/AlCrN(5:5)/AlTiN(67:33)/CrN | 36.7 | 35.9 | 0.31 | 42 |
| 7 | TiAlN(5:5)/AlCrN(7:3)/TiAlN(5:5)/NbN | 36.9 | 36 | 0.41 | 41 |
| 8 | TiAlN(5:5)/AlCrN(7:3)/TiAlN(5:5)/VN | 37 | 36 | 0.39 | 41 |
| 9 | TiAlN(5:5)/AlCrN(7:3)/TiAlN(5:5)/CrN | 36.4 | 35.2 | 0.32 | 40 |
| 10 | AlTiN(67:33)/AlCrN(7:3)/AlTiN(67:33)/NbN | 38.1 | 37 | 0.41 | 40 |
| 11 | AlTiN(67:33)/AlCrN(7:3)/AlTiN(67:33)/VN | 38.4 | 37 | 0.39 | 42 |
| 12 | AlTiN(67:33)/AlCrN(7:3)/AlTiN(67:33)/CrN | 37.2 | 36 | 0.32 | 40 |

TABLE 6

| Comparative Example No. | Nano Multi-layered Structure (Target Composition Ratio) | Room Temperature Hardness (GPa) | Degradation Hardness (GPa) | Friction Coefficient (COF) | Crack Length (μm) |
|---|---|---|---|---|---|
| 1 | TiAlN(5:5)/AlCrN(7:3) | 31 | 27 | 0.5 | 43 |
| 2 | AlTiN(67:33)/AlCrN(7:3) | 32 | 27.5 | 0.4 | 49 |
| 3 | TiAlN(5:5)/AlCrN(5:5) | 30 | 27.1 | 0.37 | 44 |
| 4 | AlTiN(67:33)/AlCrN(5:5) | 31 | 28 | 0.4 | 45 |
| 5 | TiAlN(5:5)/NbN | 35 | 33 | 0.71 | 44 |
| 6 | TiAlN(5:5)/VN | 34.7 | 33.1 | 0.52 | 42 |
| 7 | TiAlN(5:5)/CrN | 28 | 24 | 0.38 | 42 |
| 8 | TiAlN(5:5)/AlCrN(7:3)/NbN | 35.4 | 31.5 | 0.49 | 49 |
| 9 | TiAlN(5:5)/AlCrN(7:3)/VN | 35.8 | 33 | 0.5 | 48 |
| 10 | TiAlN(5:5)/AlCrN(7:3)/CrN | 31.1 | 32.1 | 0.41 | 44 |
| 11 | AlTiN(67:33)/AlCrN(5:5)/NbN | 36.4 | 33 | 0.52 | 49 |
| 12 | AlTiN(67:33)/AlCrN(5:5)/VN | 36.1 | 34.2 | 0.5 | 51 |
| 13 | AlTiN(67:33)/AlCrN(5:5)/CrN | 34 | 33.8 | 0.45 | 48 |

As confirmed in Tables 5 and 6, the hard films having an alternately stacked structure of A/B except for some thin films of nano multi-layered compositions, have a room temperature hardness of 28 GPa to 34.7 GPa which is very low compared to a room temperature hardness of 36.2 GPa to 38.4 GPa of Examples 1 to 12 of the present invention, and especially, have a degradation hardness of GPa to 33.1 GPa which very low compared to the degradation hardness of 35.2 GPa to 37 GPa of Examples 1 to 12 of the present invention, and therefore, it may be confirmed that hardness is remarkably reduced under a high temperature degradation environment.

Furthermore, it has been confirmed that Comparative Examples 1 to 7 have a friction coefficient of 0.4 to 0.71 which is high compared to a friction coefficient of 0.31 to 0.46 of Examples 1 to 12 of the present invention, and have a crack length of 42 μm to 49 μm, whereas Examples 1 to 12 of the present invention have a crack length of 40 μm and 45 μm all of which are short within of 45 μm, and therefore the hard films for a cutting tool according to Examples of the present invention are excellent in toughness.

Meanwhile, in Comparative Examples 8 to 13, the hard films having an alternately stacked structure different from the hard films for a cutting tool according to Examples of the present invention, have room temperature hardness of 31.1 GPa to 36.4 GPa which is high compared to Comparative Examples 1 to 7, but is still low compared to room temperature hardness of 36.2 GPa to 38.4 GPa of Examples 1 to 12 of the present invention, and have degradation hardness of 31.5 GPa to 34.2 GPa which is very low compared to degradation hardness of 35.2 GPa to 37 GPa of Examples 1 to 12 of the present invention, and therefore, it has been shown that hardness thereof is remarkably reduced under a high temperature degradation environment like Examples 1 to 7.

Furthermore, it has been confirmed that Comparative Examples 8 to 13 have a friction coefficient of 0.41 to 0.52 which is high compared to a friction coefficient of 0.31 to 0.46 of Examples 1 to 12 of the present invention, and have a crack length of 44 μm to 51 μm, whereas Examples 1 to 12 of the present invention have a crack length of 40 μm and 45 μm all of which are short within of 45 μm, and therefore, the hard films for a cutting tool according to Examples of the present invention are very excellent in toughness.

It may be seen that the hard films of Examples 1 to 12 of the present invention have hardness, lubrication (friction coefficient) and toughness (crack resistant) evenly improved compared to the hard films of Comparative Examples 1 to 13 from evaluations with respect to physical properties of the hard films described above.

Evaluation of Abrasion Resistance

In order to evaluate cutting performance when the hard films of Examples 1 to 12 of the present invention and Comparative Examples 1 to 13 are used in a cutting requiring for especially abrasion resistance, a milling cutting test was performed under conditions of a workpiece: alloy steel (SCM440, a milling process), a Sample Type No. SPKN1504EDSR (ISO), cutting speed: 200 m/min, cutting feed rate: 0.2 mm/tooth, and cutting depth: 2 mm, and results are respectively shown in the following Tables 7 and 8.

TABLE 7

| Example No. | Nano Multi-layered Structure (Target Composition Ratio) | Cutting Life cycle (cutting length. M) | Life cycle End Factor |
|---|---|---|---|
| 1 | TiAlN(5:5)/AlCrN(5:5)/TiAlN(5:5)/NbN | 18 | normal abrasion |

TABLE 7-continued

| Example No. | Nano Multi-layered Structure (Target Composition Ratio) | Cutting Life cycle (cutting length. M) | Life cycle End Factor |
|---|---|---|---|
| 2 | TiAlN(5:5)/AlCrN(5:5)/TiAlN(5:5)/VN | 18.5 | normal abrasion |
| 3 | TiAlN(5:5)/AlCrN(5:5)/TiAlN(5:5)/CrN | 16.4 | normal abrasion |
| 4 | AlTiN(67:33)/AlCrN(5:5)/AlTiN(67:33)/NbN | 19.5 | normal abrasion |
| 5 | AlTiN(67:33)/AlCrN(5:5/AlTiN(67:33)/VN | 20 | normal abrasion |
| 6 | AlTiN(67:33)/AlCrN(5:5)/AlTiN(67:33)/CrN | 17 | normal abrasion |
| 7 | TiAlN(5:5)/AlCrN(7:3)/TiAlN(5:5)/NbN | 18.5 | normal abrasion |
| 8 | TiAlN(5:5)/AlCrN(7:3)/TiAlN(5:5)/VN | 18.5 | normal abrasion |
| 9 | TiAlN(5:5)/AlCrN(7:3)/TiAlN(5:5)/CrN | 17 | normal abrasion |
| 10 | AlTiN(67:33)/AlCrN(7:3)/AlTiN(67:33)/NbN | 21 | normal abrasion |
| 11 | AlTiN(67:33)/AlCrN(7:3)/AlTiN(67:33)/VN | 21.5 | normal abrasion |
| 12 | AlTiN(67:33)/AlCrN(7:3)/AlTiN(67:33)/CrN | 19 | normal abrasion |

TABLE 8

| Comparative Example No. | Nano Multi-layered Structure (Target Composition Ratio) | Cutting Life cycle (cutting length. M) | Life cycle End Factor |
|---|---|---|---|
| 1 | TiAlN(5:5)/AlCrN(7:3) | 7 | excessive abrasion |
| 2 | AlTiN(67:33)/AlCrN(7:3) | 7.5 | excessive abrasion |
| 3 | TiAlN(5:5)/AlCrN(5:5) | 7 | excessive abrasion |
| 4 | AlTiN(67:33)/AlCrN(5:5) | 7.2 | excessive abrasion |
| 5 | TiAlN(5:5)/NbN | 8.4 | fracture |
| 6 | TiAlN(5:5)/VN | 9.2 | fracture |
| 7 | TiAlN(5:5)/CrN | 5 | excessive abrasion |
| 8 | TiAlN(5:5)/AlCrN(7:3)/NbN | 15.1 | excessive abrasion |
| 9 | TiAlN(5:5)/AlCrN(7:3)/VN | 15.3 | excessive abrasion |
| 10 | TiAlN(5:5)/AlCrN(7:3)/CrN | 11 | excessive abrasion |
| 11 | AlTiN(67:33)/AlCrN(5:5)/NbN | 12 | normal abrasion |
| 12 | AlTiN(67:33)/AlCrN(5:5)/VN | 13.5 | normal abrasion |
| 13 | AlTiN(67:33)/AlCrN(5:5)/CrN | 11.5 | excessive abrasion |

As confirmed in Tables 7 and 8, Examples 1 to 12 of the present invention have cutting life of 17 m to 21.5 m all of which are 17 m or more, and a life cycle end factor corresponding to normal abrasion, however, the hard films of Comparative Examples 1 to 7 having an alternately stacked structure except for some thin films of nano multi-layered composition, have not ended there life cycle through normal abrasion, but have ended the life cycle through fracture or excessive abrasion compared to the hard films for a cutting tool according to Examples of the present invention, and having cutting life cycle of only 5 m to 9.2 m all of which are less than 10 m. Therefore, it may be confirmed that the abrasion resistance of Comparative Examples is remarkably low.

Also, in Examples 8 to 13, the hard films having an alternately stacked structure of A/B/C different from the hard films for a cutting tool according to Examples of the present invention except for Comparative Examples 11 and 12, have not ended there life cycle through normal abrasion, but have ended the life cycle through excessive abrasion, and have cutting life cycle of 11 m to 15.3 m all of which are less than 16 m, although including Comparative Examples 11 and that have ended there life cycle through normal abrasion. Therefore, it may be confirmed that the abrasion resistance of Comparative Examples is remarkably low compared to cutting life of 17 m to 21.5 m of Example 1 to 12 of the present invention.

It may be confirmed that the hard films for a cutting tool of Examples 1 to 12 of the present invention except for some thin films thereof have an excellent abrasion resistance characteristic compared to the hard films having an alternative stack structure of A/B or A/B/C.

Evaluation of Toughness (Impact Resistance)

In order to evaluate cutting performance when hard films of Examples 1 to 12 of the present invention and Comparative Examples 1 to 13 in a cutting condition requiring especially, toughness (impact resistance), a milling processing impact resistance cutting performance evaluation (interrupted evaluation) was performed under conditions of a workpiece: alloy steel (SCM440, 3 line diaphragm milling processing), Sample Type No. SPKN1504EDSR (ISO), cutting speed: 200 m/min, cutting feed rate: 0.2 mm/tooth, and cutting depth: 2 mm, the evaluation was performed until a fracture of an insert coated with a hard film, and the results are shown in the following Tables 9 and 10.

TABLE 9

| Example No. | Nano Multi-layered Structure (Target Composition Ratio) | Cutting Life cycle (cutting length. M) |
|---|---|---|
| 1 | TiAlN(5:5)/AlCrN(5:5)/TiAlN(5:5)/NbN | 8.9 |
| 2 | TiAlN(5:5)/AlCrN(5:5)/TiAlN(5:5)/VN | 9.5 |
| 3 | TiAlN(5:5)/AlCrN(5:5)/TiAlN(5:5)/CrN | 10 |
| 4 | AlTiN(67:33)/AlCrN(5:5)/AlTiN(67:33)/NbN | 8.5 |
| 5 | AlTiN(67:33)/AlCrN(5:5)/AlTiN(67:33)/VN | 8.5 |
| 6 | AlTiN(67:33)/AlCrN(5:5)/AlTiN(67:33)/CrN | 9 |
| 7 | TiAlN(5:5)/AlCrN(7:3)/TiAlN(5:5)/NbN | 8.5 |
| 8 | TiAlN(5:5)/AlCrN(7:3)/TiAlN(5:5)/VN | 8.7 |
| 9 | TiAlN(5:5)/AlCrN(7:3)/TiAlN(5:5)/CrN | 10 |
| 10 | AlTiN(67:33)/AlCrN(7:3)/AlTiN(67:33)/NbN | 8.5 |
| 11 | AlTiN(67:33)/AlCrN(7:3)/AlTiN(67:33)/VN | 8.5 |
| 12 | AlTiN(67:33)/AlCrN(7:3)/AlTiN(67:33)/CrN | 10 |

TABLE 10

| Comparative Example No. | Nano Multi-layered Structure (Target Composition Ratio) | Cutting Life cycle (cutting length. M) |
|---|---|---|
| 1 | TiAlN(5:5)/AlCrN(7:3) | 6.1 |
| 2 | AlTiN(67:33)/AlCrN(7:3) | 6.5 |
| 3 | TiAlN(5:5)/AlCrN(5:5) | 6.5 |
| 4 | AlTiN(67:33)/AlCrN(5:5) | 6.5 |
| 5 | TiAlN(5:5)/NbN | 7.2 |
| 6 | TiAlN(5:5)/VN | 7 |
| 7 | TiAlN(5:5)/CrN | 6.5 |
| 8 | TiAlN(5:5)/AlCrN(7:3)/NbN | 7.7 |
| 9 | TiAlN(5:5)/AlCrN(7:3)/VN | 8 |
| 10 | TiAlN(5:5)/AlCrN(7:3)/CrN | 8.1 |
| 11 | AlTiN(67:33)/AlCrN(5:5)/NbN | 8.2 |
| 12 | AlTiN(67:33)/AlCrN(5:5)/VN | 8.4 |
| 13 | AlTiN(67:33)/AlCrN(5:5)/CrN | 8 |

As confirmed in Tables 9 and 10, Examples 1 to 12 of the present invention have cutting life cycle of 8.9 m to 10 m, whereas Comparative Examples 1 to 13 have cutting life cycle of 6.1 m to 8.4 all of which are less than 8.5 m, and therefore, it is shown that the hard films for a cutting tool according to Examples of the present invention are excellent in impact resistant.

Evaluation of Comprehensive Cutting Performance

Generally, since a drilling has a cutting speed which is slow compared to a milling, and is performed under a wet condition, lubrication (seizure resistance) and toughness are very important. In order to comprehensively evaluate lubrication, chipping resistance, toughness and abrasion resistance the hard films according to Examples 1 to 12 of the present invention and Comparative Examples 1 to 13, a drilling cutting performance evaluations were performed under conditions of a workpiece: carbon steel (SM45C, a carbon steel drilling), Sample Type No. SPMT07T208/XOMT07T205 (indexable drill insert, 20Φ-5D), cutting speed: 150 m/min, cutting feed rate: 0.1 mm/tooth, and cutting depth: 90 mm (penetration), and the results are shown the following Tables 11 and 12.

TABLE 11

| Example No. | Nano Multi-layered Structure (Target Composition Ratio) | Cutting Life cycle (hole: 20Φ-90 mm) | Life cycle End Factor |
|---|---|---|---|
| 1 | TiAlN(5:5)/AlCrN(5:5)/TiAlN(5:5)/NbN | 256 | normal abrasion |
| 2 | TiAlN(5:5)/AlCrN(5:5)/TiAlN(5:5)/VN | 256 | normal abrasion |
| 3 | TiAlN(5:5)/AlCrN(5:5)/TiAlN(5:5)/CrN | 256 | normal abrasion |
| 4 | AlTiN(67:33)/AlCrN(5:5)/AlTiN(67:33)/NbN | 256 | normal abrasion |
| 5 | AlTiN(67:33)/AlCrN(5:5)/AlTiN(67:33)/VN | 256 | normal abrasion |
| 6 | AlTiN(67:33)/AlCrN(5:5)/AlTiN(67:33)/CrN | 256 | normal abrasion |
| 7 | TiAlN(5:5)/AlCrN(7:3)/TiAlN(5:5)/NbN | 256 | normal abrasion |
| 8 | TiAlN(5:5)/AlCrN(7:3)/TiAlN(5:5)/VN | 256 | normal abrasion |
| 9 | TiAlN(5:5)/AlCrN(7:3)/TiAlN(5:5)/CrN | 250 | normal abrasion |
| 10 | AlTiN(67:33)/AlCrN(7:3)/AlTiN(67:33)/NbN | 256 | normal abrasion |
| 11 | AlTiN(67:33)/AlCrN(7:3)/AlTiN(67:33)/VN | 256 | normal abrasion |
| 12 | AlTiN(67:33)/AlCrN(7:3)/AlTiN(67:33)/CrN | 256 | normal abrasion |

TABLE 12

| Comparative Example No. | Nano Multi-layered Structure (Target Composition Ratio) | Cutting Life cycle (hole: 20Φ-90 mm) | Life cycle End Factor |
|---|---|---|---|
| 1 | TiAlN(5:5)/AlCrN(7:3) | 52 | excessive abrasion |
| 2 | AlTiN(67:33)/AlCrN(7:3) | 52 | excessive abrasion |
| 3 | TiAlN(5:5)/AlCrN(5:5) | 52 | excessive abrasion |
| 4 | AlTiN(67:33)/AlCrN(5:5) | 52 | excessive abrasion |
| 5 | TiAlN(5:5)/NbN | 52 | seizure |
| 6 | TiAlN(5:5)/VN | 52 | seizure |
| 7 | TiAlN(5:5)/CrN | 26 | excessive abrasion |
| 8 | TiAlN(5:5)/AlCrN(7:3)/NbN | 156 | chipping |
| 9 | TiAlN(5:5)/AlCrN(7:3)/VN | 156 | seizure |

TABLE 12-continued

| Comparative Example No. | Nano Multi-layered Structure (Target Composition Ratio) | Cutting Life cycle (hole: 20Φ-90 mm) | Life cycle End Factor |
|---|---|---|---|
| 10 | TiAlN(5:5)/AlCrN(7:3)/CrN | 156 | excessive abrasion |
| 11 | AlTiN(67:33)/AlCrN(5:5)/NbN | 256 | excessive abrasion |
| 12 | AlTiN(67:33)/AlCrN(5:5)/VN | 256 | excessive abrasion |
| 13 | AlTiN(67:33)/AlCrN(5:5)/CrN | 208 | excessive abrasion |

From the results of Tables 11 and 12, it is shown that the cutting tools on which the hard films of Examples 1 to 12 of the present invention are formed, have life cycle which is considerably high compared to Comparative Examples 1 to 13. All of Comparative Example 1 to 13 show life cycle which is ended through seizure, chipping or excessive abrasion, and in a comprehensive cutting performance evaluation, the hard films of Examples 1 to 12 of the present invention all having ended their life through normal abrasion show very excellent performance.

Like this, since a nano multi-layered structure formed by stacking, in order of thin layers A-B-A-C, a Ti and Al composite nitride layer (a thin layer A) having excellent abrasion resistance, an Al and Cr composite nitride layer (a thin layer B) having excellent lubrication and any one of Nb, V and Cr nitride layer (a thin layer C) having excellent chipping resistance and having lubrication improved under a high temperature environment, may evenly improve various characteristics required for a hard film for a cutting tool, such as abrasion resistance, lubrication, toughness, and chipping resistance, it has been confirmed that the nano multi-layered structure may be suitably used in a cutting tool for a difficult-to-cut material.

Especially, a nano multi-layered structure of the present invention shows evenly excellent in various characteristics compared to Comparative Examples 8 to 13 including three thin layers included in the hard films for a cutting tool according to the present invention but and formed by sequentially and alternately stacking the three thin layers, therefore, it has been confirmed that the nano-multi-layered structure realized in a type that a Ti and Al composite nitride layer (a thin layer A) is interposed between a thin layer B and a thin layer C, plays no small part in performance improvement of a hard film.

While only detailed Examples of the present invention has been particularly shown and described, it will be apparent to those skilled in the art that various changes in form and details may be made therein without departing from the spirit and scope of the invention, and it is reasonable that all differences related in the modification and application thereof will belong to the following claims.

The invention claimed is:

1. A hard film formed on a surface of a base material, comprising:
a nano multi-layered structure formed by stacking a thin layer A, a thin layer B, and a thin layer C in order of thin layers A-B-A-C from the base material,
wherein the A-B-A-C layered structure is repeatedly stacked at least twice,
wherein the thin layer A is comprised of $Ti_{1-x}Al_xN$ ($0.3 \leq x \leq 0.7$); the thin layer B is comprised of $Al_{1-y}Cr_yN$ ($0.3 \leq y \leq 0.7$); and the thin layer C is comprised of MeN, wherein Me is any one of Nb, V, and Cr.

2. The hard film of claim 1, wherein each of the thin layer A, the thin layer B and the thin layer C has an average thickness of 3 nm to 50 nm.

3. The hard film of claim 1, wherein each of the thin layer A, the thin layer B and the thin layer C has an average thickness of 20 nm to 40 nm.

4. The hard film of claim 1, wherein the hard film has an average thickness of 1 μm to 20 μm.

5. The hard film of claim 1, wherein the hard film has a degradation hardness not less than 35 GPa when degradation-treated at a temperature of 900° C. for 30 minutes.

* * * * *